United States Patent [19]
Brehmer et al.

[11] Patent Number: 5,818,293
[45] Date of Patent: Oct. 6, 1998

[54] HIGH SPEED ANALOG FLIP-FLOP WITH EMBEDDED LOGIC AND PHASE-LOCKED-LOOP CIRCUIT EMPLOYING THE SAME

[75] Inventors: Geoffrey E. Brehmer, Lexington; Daren Allee, Austin, both of Tex.

[73] Assignee: Advanced Micro Devices, Inc., Sunnyvale, Calif.

[21] Appl. No.: 806,289

[22] Filed: Feb. 26, 1997

[51] Int. Cl.$^6$ .................................................. H03K 3/356
[52] U.S. Cl. .......................... 327/202; 327/156; 327/203; 327/215
[58] Field of Search .................................. 327/156, 202, 327/203, 215

[56] References Cited

U.S. PATENT DOCUMENTS

| | | | |
|---|---|---|---|
| 4,975,595 | 12/1990 | Robert et al. | 327/202 |
| 5,001,361 | 3/1991 | Tamamura et al. | 327/202 |
| 5,200,650 | 4/1993 | Cowley et al. | 327/202 |
| 5,576,651 | 11/1996 | Phillips | 327/202 |
| 5,661,426 | 8/1997 | Ichimaru | 327/202 |

*Primary Examiner*—Son T. Dinh
*Attorney, Agent, or Firm*—B. Noel Kivlin; Conley, Rose & Tayon

[57] ABSTRACT

A phase-locked-loop circuit including a prescaler which divides the frequency of an output signal to thereby generate a frequency-divided signal which is provided as a feedback signal to a phase detector of the phase-locked-loop circuit. The prescaler includes a plurality of analog flip-flop circuits serially connected in a chain, with one or more outputs of latter analog flip-flop stages in the chain being fed back to one or more inputs of the first analog flip-flop. Embedded logic is integrated with the differential input pair of the first analog flip-flop to conditionally control the output of the first analog flip-flop based upon the feedback signals from the latter flip-flop stages. The analog flip-flop with embedded logic includes a master section for setting a state of a differential set up signal in response to an occurrence of a first phase of a clock signal. The master section includes a differential pair of transistors coupled to differentially control a flow current through a first and a second load during a second phase of the clock signal. First and second logic circuits are provided in the place of an input differential pair of transistors which control the flow of current through the first and second loads during the first phase of the clock signal. The first logic circuit includes a first transistor and a second transistor each connected to conduct current which flows through the first load. A second logic circuit may be similarly configured with third and fourth transistors which conduct a current which flows through the second load.

27 Claims, 10 Drawing Sheets

HIGH SPEED ANALOG FLIP-FLOP WITH EMBEDDED LOGIC AND PHASE-LOCKED-LOOP CIRCUIT EMPLOYING THE SAME

BACKGROUND OF THE INVENTION

1. Field of the Invention

The present invention relates to analog flip-flop circuits and more particularly to analog flip-flop circuits employed within prescaler units of phase-locked-loop circuits.

2. Description of the Related Art

Recent advances in CMOS technology and the explosion of personal wireless communication devices have stimulated designers and researchers to explore cost reduced methods for radio technology. One approach for cost reduction has been to integrate more and more radio functions into fewer and fewer integrated circuits for implementation in CMOS technology. The frequency synthesizer is an exemplary system to which such cost reducing efforts have been applied. Typical frequency synthesizers are of the phase-lock-loop (PLL) type as shown in FIG. 1. The voltage controlled oscillator 10, or VCO, is typically implemented off chip with a tunable LC-tank circuit. Likewise, the loop filter 12 is also typically implemented off chip since its frequency characteristics do not readily accommodate integration into CMOS technology. The phase detector 14 and prescaler 16 functions, however, are two radio functions that are currently being studied for CMOS integration.

The basic functionality of the divide-by-N PLL synthesizer includes a VCO that is a tunable device of a known frequency range. In FIG. 1 the output of VCO 10 is divided down by a prescaler 16 whose output is fed to one of the inputs of phase detector 14. The output of prescaler 16 is compared to a reference frequency f_ref by phase detector 14. The loop filter 12 at the output of the phase detector 14 suppresses reference frequency components, while serving as an integrator. The dc control voltage at the output of the loop filter 12 controls the VCO 10 such that the divided frequency and phase of the output of prescaler 16 equal those of the reference frequency. In applications such as the cellular radio, a dual-modulus prescaler function is typically required for easy changing of synthesized frequencies.

The VCO 10 and prescaler 16 are the only circuits that are required to operate at full frequency (i.e., the frequency of the output signal f_out), while the remaining system components operate at reduced speeds. Typical radio frequency, RF, or intermediate frequency, IF, prescalers can have oscillator frequencies from hundreds of megahertz to gigahertz; hence, implementing the prescaler function into a CMOS technology may require analog circuit techniques with reduced sine wave clocking compared to standard CMOS digital logic and full CMOS logic clocks.

FIG. 2 illustrates a conventional divide by 128/129 dual-modulus prescaler architecture. There is a synchronous divide-by-4/5 dual-modulus section 20 clocked with the VCO frequency, an asynchronous fixed divide-by-32 section 22, and some combinatorial logic 24 that develop the full 128/129 divided-by function. The most difficult section to implement in a CMOS technology is the divide-by-4/5 section 20 since all flip-flops and digital combinatorial feedback circuits therein (i.e., flip-flops 25–27 and gates 28 and 29) must operate at the full frequency of the input frequency f_in. Similarly, FIG. 3 illustrates a conventional divide-by-8/9 dual-modulus prescaler that implements a divide-by-4/5 section 30 with a fixed divide-by-2 section formed by flip-flop 32. Again, all flip-flops 33–35 and the digital combinatorial feedback circuitry (i.e., gates 305–306) in the divide-by-4/5 section 30 must operate at the full frequency of the input frequency.

FIG. 4 is a schematic diagram that illustrates an implementation of a typical analog CMOS flip-flop with active loads, and FIG. 5 is a schematic diagram of a typical analog CMOS flip-flop with passive loads. In both circuits, the loads are identified with reference numerals 40–43. Each circuit includes a differential input pair of transistors 44 and additional differential pairs 45–47. Clocked switches formed by transistors 50 and 53 allow current flow through differential pairs 44 and 47 during a high phase of the input clock signal, while clocked switches formed by transistors 51 and 52 allow current flow through differential pairs 45 and 46, respectively, during a low phase of the clock signal. Current sinks are further provided with transistors 54 and 55. The analog flip-flop implementation of FIG. 4 or FIG. 5 may be employed within the prescaler circuits of FIGS. 2 and 3 to accommodate higher frequencies of operation. However, while the analog flip-flop circuitry as illustrated in FIGS. 4 and 5 operates quite well at high frequencies, the digital combinatorial feedback logic which must operate at the full frequency of the input clock as illustrated in FIGS. 2 and 3 is difficult to integrate with the high speed analog flip-flop architectures. At high frequencies, the gates forming the digital combinatorial feedback logic of FIGS. 2 and 3 do not have full CMOS logic levels as inputs and thus the overall performance of the prescaler may be degraded.

It would therefore be desirable to provide circuitry which would allow for implementation of the functionality of the feedback circuitry in prescaler units which accommodates high frequencies of operation.

SUMMARY OF THE INVENTION

The problems outlined above are in large part solved by a high speed analog flip-flop circuit with embedded logic and a prescaler in a phase-locked-loop circuit employing the same. In one embodiment, a phase-locked-loop circuit is provided including a prescaler which divides the frequency of an output signal of the phase-locked-loop circuit to thereby generate a frequency-divided signal which is provided as a feedback signal to a phase detector of the phase-locked-loop circuit. The prescaler may divide the frequency of the output signal of the phase-locked-loop circuit in accordance with a predetermined modulus. The prescaler includes a plurality of analog flip-flop circuits serially connected in a chain, with one or more outputs of latter analog flip-flop stages in the chain being fed back to one or more inputs of the first analog flip-flop. One or more digital flip-flops may further be serially connected to an output of the serial chain of analog flip-flops. The output of the digital flip-flop may be fed back to control additional inputs of the first analog flip-flop. Embedded logic is integrated with the differential input pair of the first analog flip-flop to conditionally control the output of the first analog flip-flop based upon the feedback signals from the latter flip-flop stages. Accordingly, the first analog flip-flop in the chain may include inputs from at least two subsequent flip-flop stages.

The analog flip-flop with embedded logic includes a master section for setting a state of a differential set up signal in response to an occurrence of a first phase of a clock signal, which may take the form of the output signal from the phase-locked-loop circuit. The state of the differential set up signal is dependent upon a state of a plurality of differential input signals. As stated previously, when employed within one implementation of a prescaler, the plurality of differential input signals are feedback signals from latter flip-flop stages in the prescaler architecture. The analog flip-flop further includes a slave section coupled to the master section which is configured to hold and drive a differential output signal in response to an occurrence of a second phase of the clock signal. The master section includes a differential pair of transistors coupled to differentially control a flow current through a first and a second load during a second phase of the clock signal. First and second logic circuits are provided in the place of an input differential pair of transistors which control the flow of current through the first and second loads during the first phase of the clock signal. The first logic circuit includes a first transistor and a second transistor each connected to conduct current which flows through the first load. A gate of the first transistor is coupled to receive a first of the differential input signals and a gate of the second transistor is coupled to receive a second of the differential input signals. A second logic circuit may be similarly configured with third and fourth transistors which conduct a current which flows through the second load. The transistors in the first and second logic circuits are connected to establish a predetermined logic function dependent upon the plurality of inputs to control the state of the flip-flop output signal. In one specific implementation, the first, second, third and fourth transistors are each implemented with the same device type as that of the differential pair of transistors (i.e., all n-channel devices or all p-channel devices). Furthermore, selected transistors in the first and second logic circuits may be implemented as low threshold devices to accommodate a robust manufacturable design.

The analog flip-flop circuit with embedded logic and a phase-locked-loop circuit employing the same may advantageously accommodate higher frequencies of operation. Accordingly, higher performance may be obtained. In addition, a circuit implementation may be created using a relatively low number of transistors, thus accommodating lower cost and smaller die sizes.

BRIEF DESCRIPTION OF THE DRAWINGS

Other objects and advantages of the invention will become apparent upon reading the following detailed description and upon reference to the accompanying drawings in which.

Figure 1:
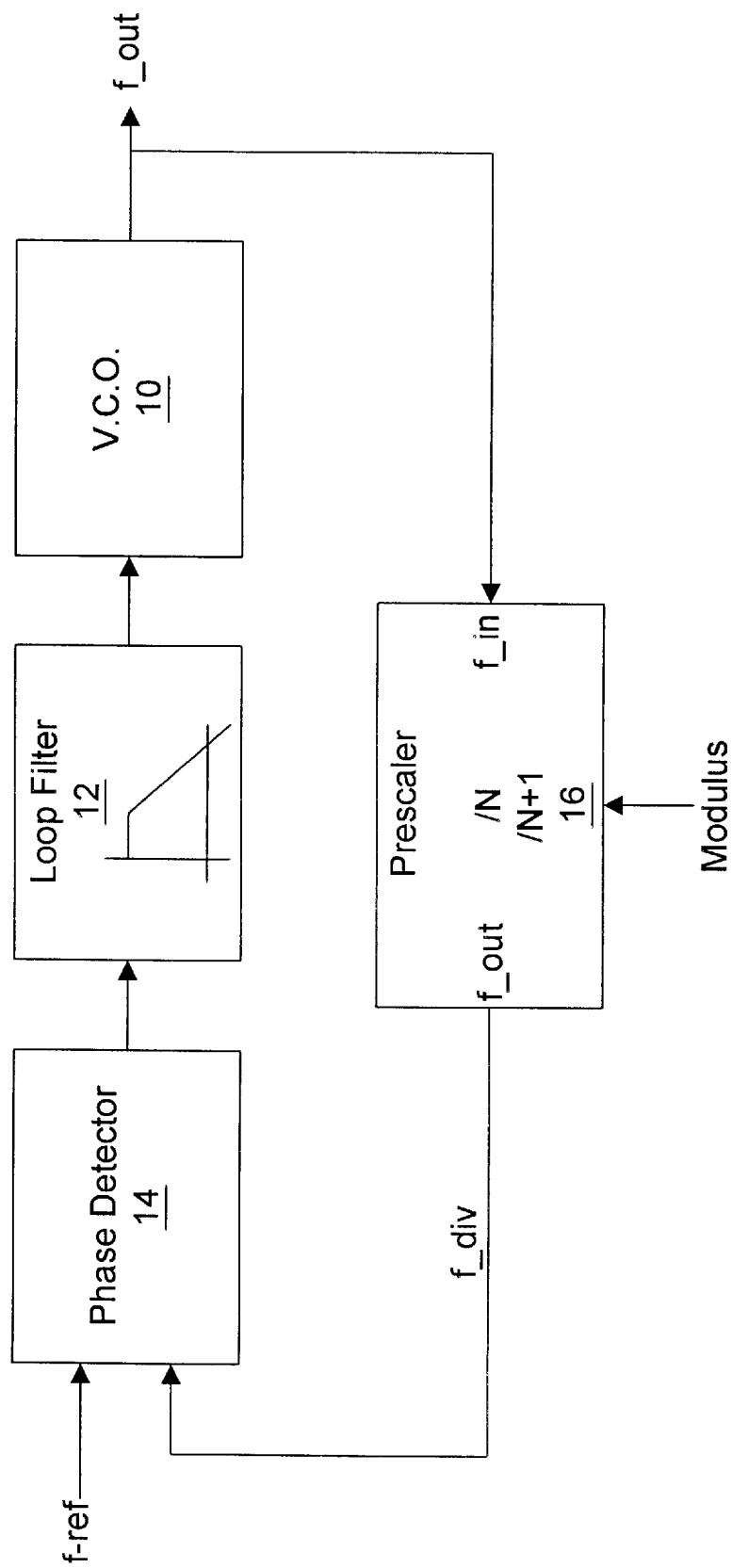
FIG. 1 is a block diagram of a typical phase-locked-loop circuit.
Figure 2:
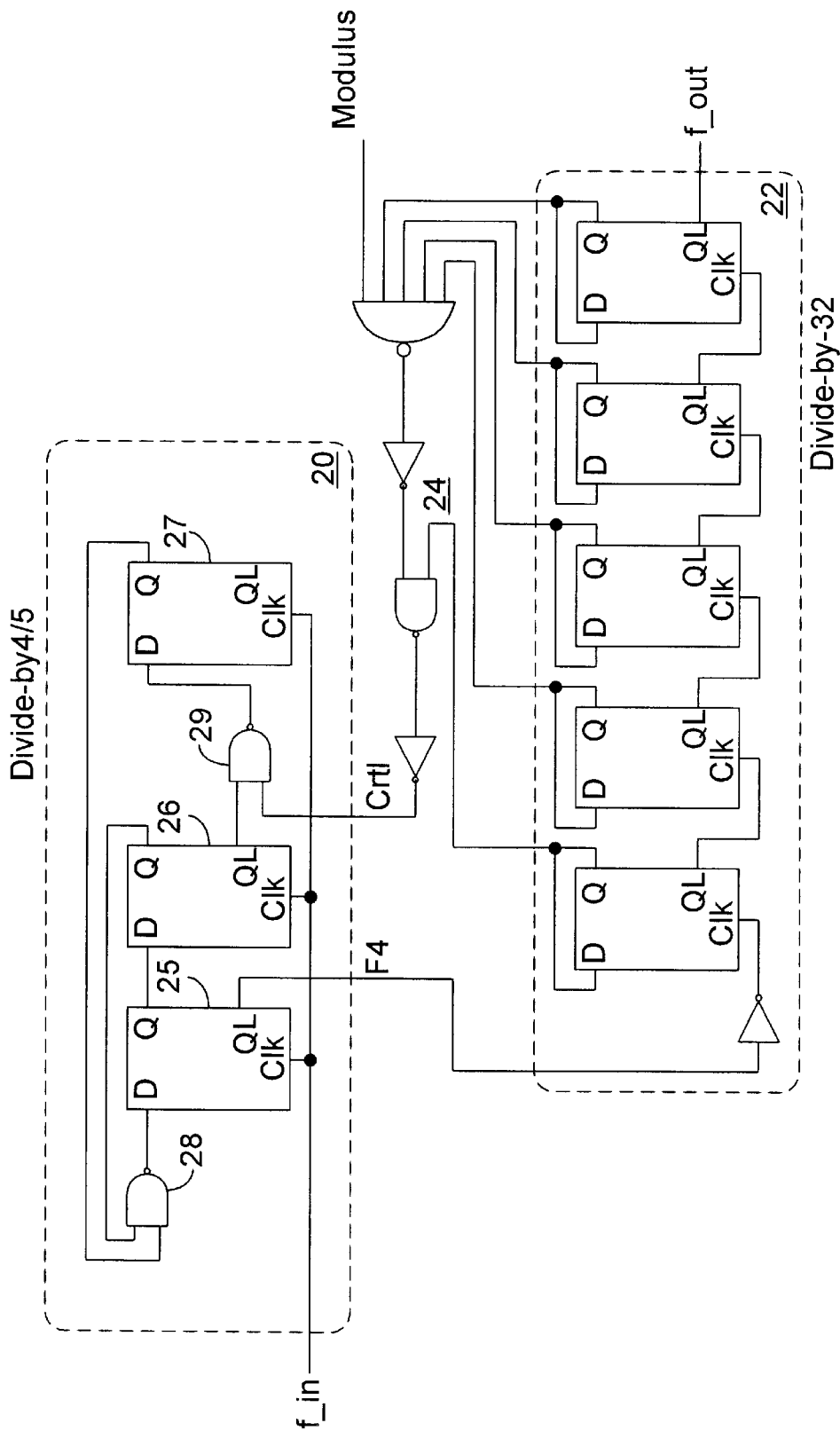
FIG. 2 is a schematic diagram that illustrates a conventional divide-by-128/129 dual modulus prescaler architecture.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 6:
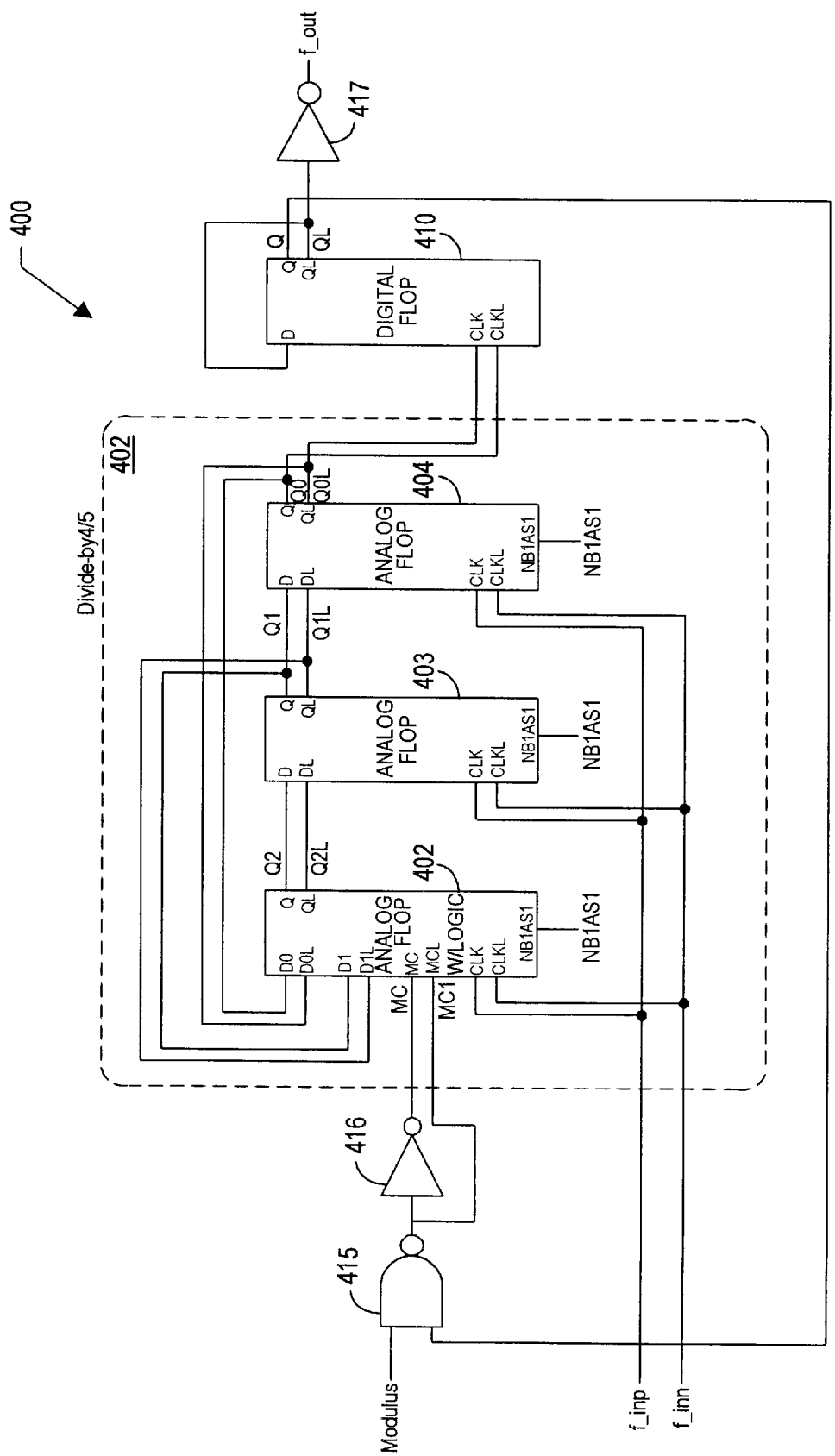
FIG. 6 is a block diagram of a divide-by-8/9 dual modulus prescaler in accordance with one embodiment of the present invention.

Turning next to FIG. 6, a block diagram of a divide-by-8/9 dual modulus prescaler 400 is shown in accordance with one embodiment of the present invention. Prescaler 400 may be employed in the place of prescaler 16 within the phase-locked-loop circuit of FIG. 1. The prescaler of FIG. 6 includes a divide-by-4/5 circuit 402 including analog flip-flop circuits 402–404. The prescaler 400 further includes a digital flip-flop 410 and logic gates 415–417. The prescaler of FIG. 6 is similar to that of FIG. 3. However, divide-by-4/5 circuit 402 is implemented using differential analog circuitry including a unique analog flip-flop 402 with embedded logic. Furthermore, the digital combinatorial logic associated with the feedback paths of latter flip-flop stages is modified.

The divide-by-4/5 circuit 402 receives an analog differential input clock signal (f_inp and f_inn) of a designated frequency which clocks each of the analog flip-flops 402–404. The analog differential input signal may be derived from the output of the VCO 10 of FIG. 1. The differential outputs (Q1, Q1L, and Q0, Q0L) of analog flip-flops 403 and 404 are further fed back directly to designated inputs of analog flip-flop 402, rather than providing the feedback signals through digital combinatorial logic to thereby generate a single input to analog flip-flop 402. As will be described in greater detail below, current flowing through a pair of differential loads associated with analog flip-flop 402 is controlled by embedded logic which is responsive to the analog differential feedback signals from analog flip-flops 403 and 404.

Figure 3:
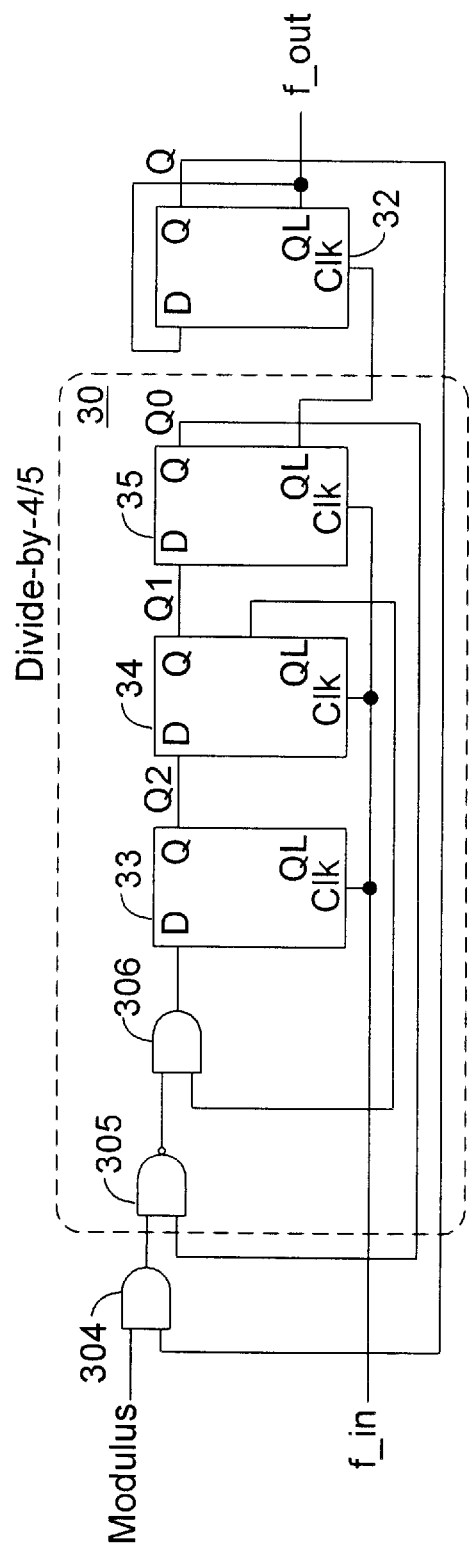
FIG. 3 is a schematic diagram that illustrates a conventional divide-by-8/9 dual modulus prescaler architecture.
Figure 7:
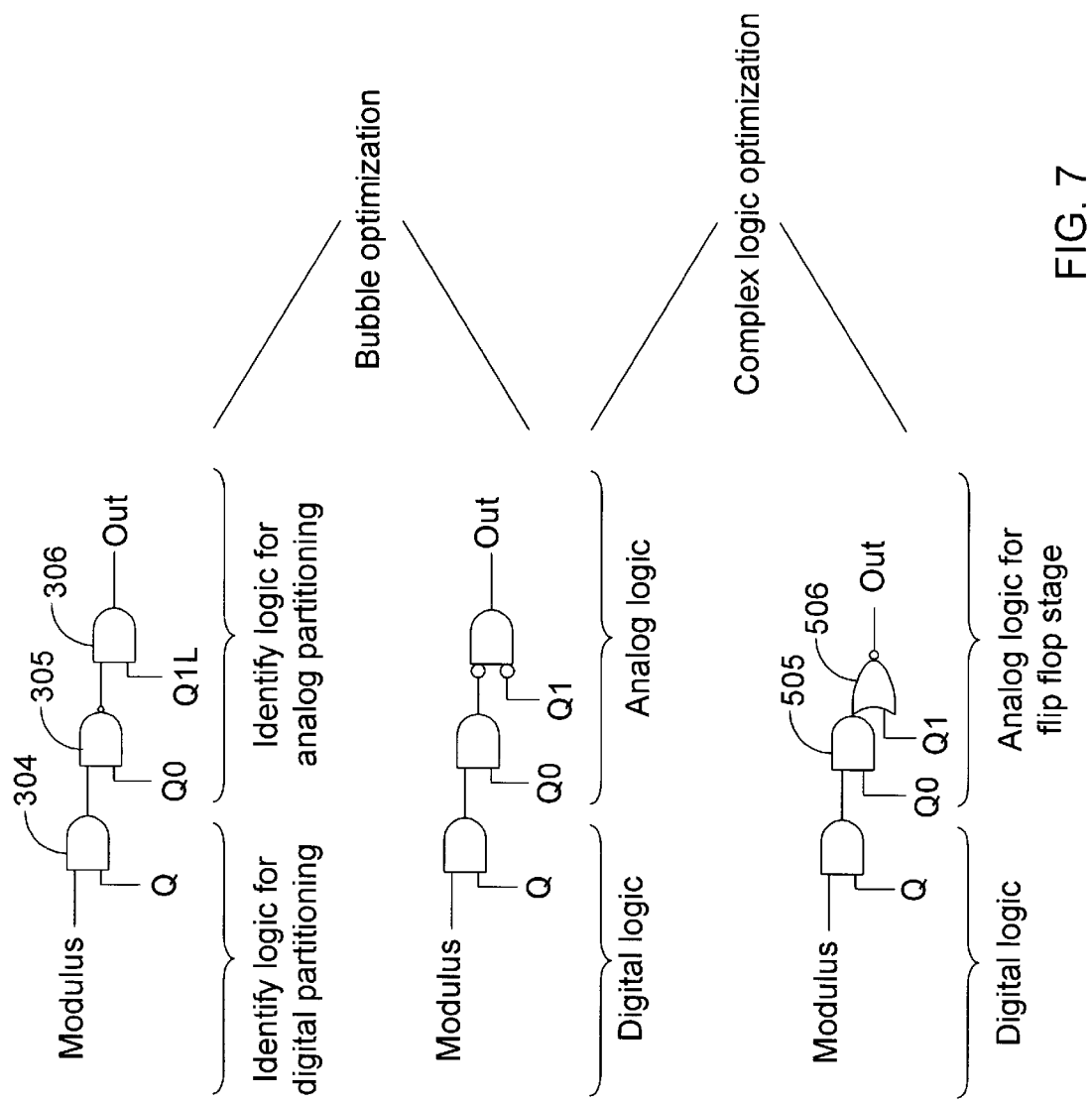
FIG. 7 is a diagram which illustrates an logic optimization of designated combinatorial logic.

FIG. 7 is a diagram which illustrates a manner in which the digital combinatorial logic of FIG. 3 coupled to an input of digital flip-flop 33 is converted using logic optimization. AND gate 304 is identified as a portion of the logic which can be implemented using digital logic due to its relatively lower frequency input characteristics. In contrast, NAND gate 305 and AND gate 306 receive inputs which switch at the full frequency of the input clock, and thus this portion of circuitry is identified for analog implementation. It is noted that the NAND-AND combination formed by gates 305 and 306 may be equivalently represented by the AND-NOR combination formed by gates 505 and 506. For the implementation of FIG. 6, the logic functionality formed by gates 505 and 506 is embedded within analog flip-flop 402 to control the current through the master stage differential loads, which consequently affects the output logic states of analog flip-flop 402.

Figure 4:
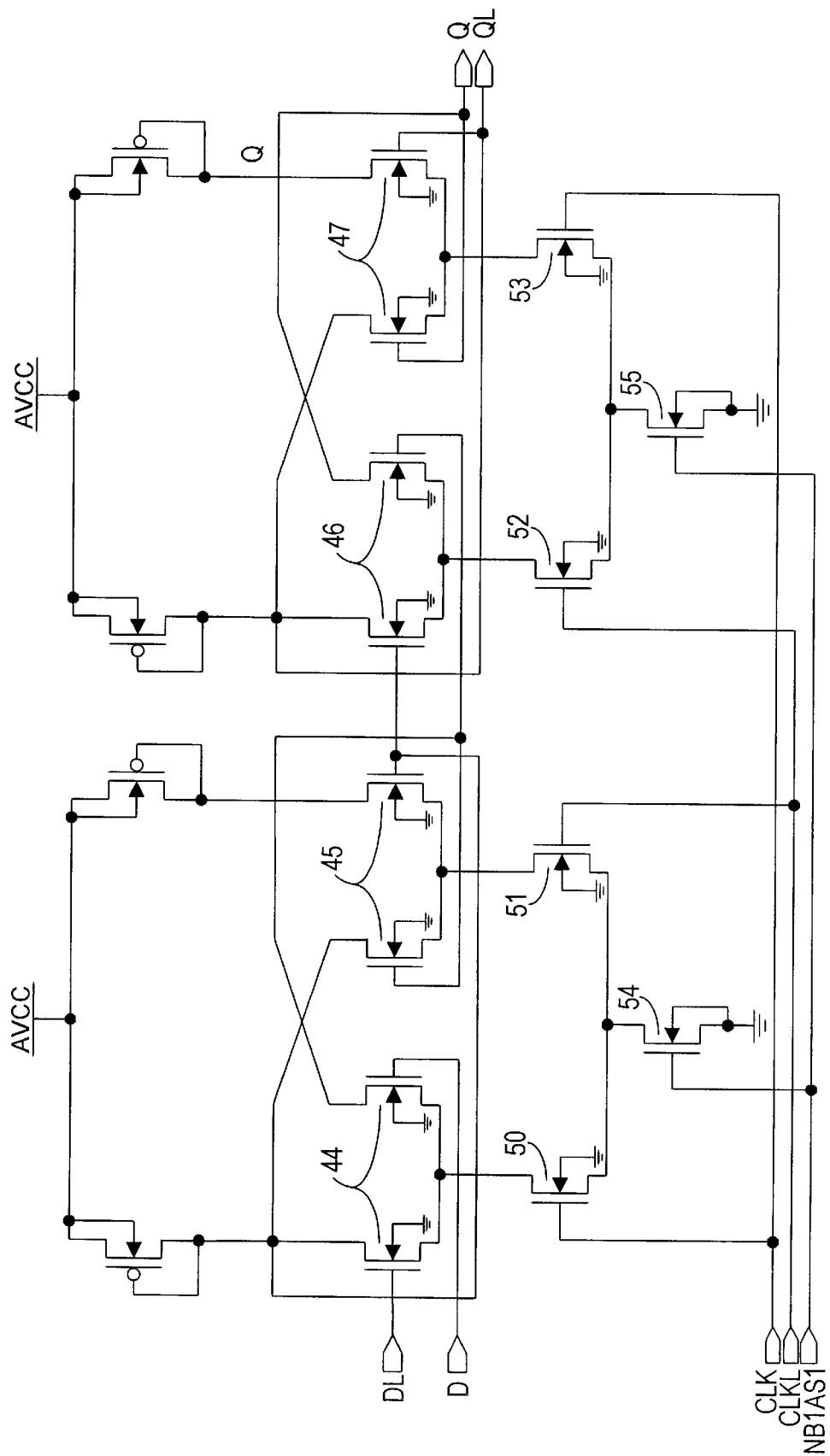
FIG. 4 is a schematic diagram that illustrates an implementation of a typical analog CMOS flip-flop with active loads.
Figure 5:
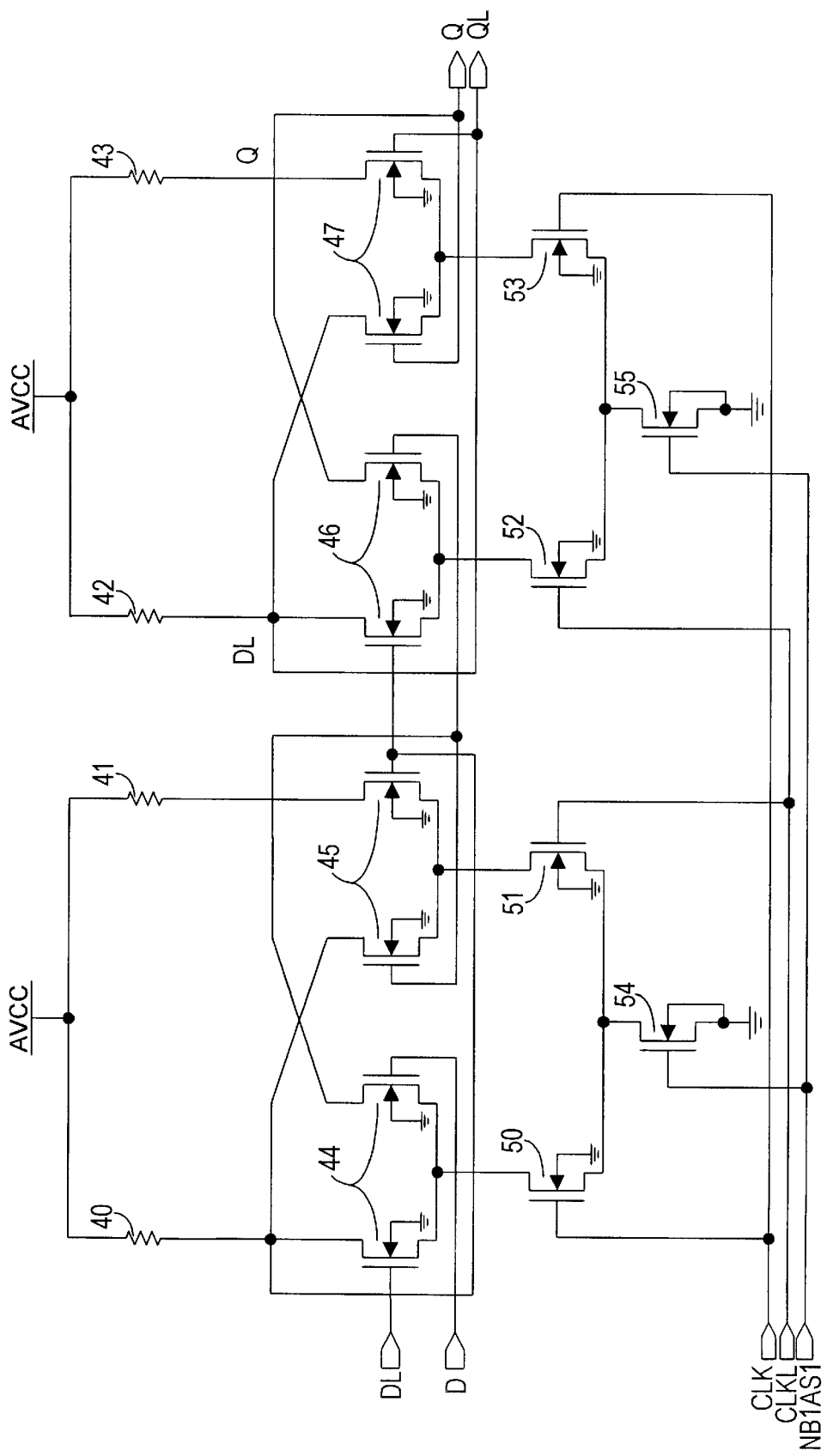
FIG. 5 is a schematic diagram that illustrates an implementation of a typical analog CMOS flip-flop with passive loads.
Figure 8:
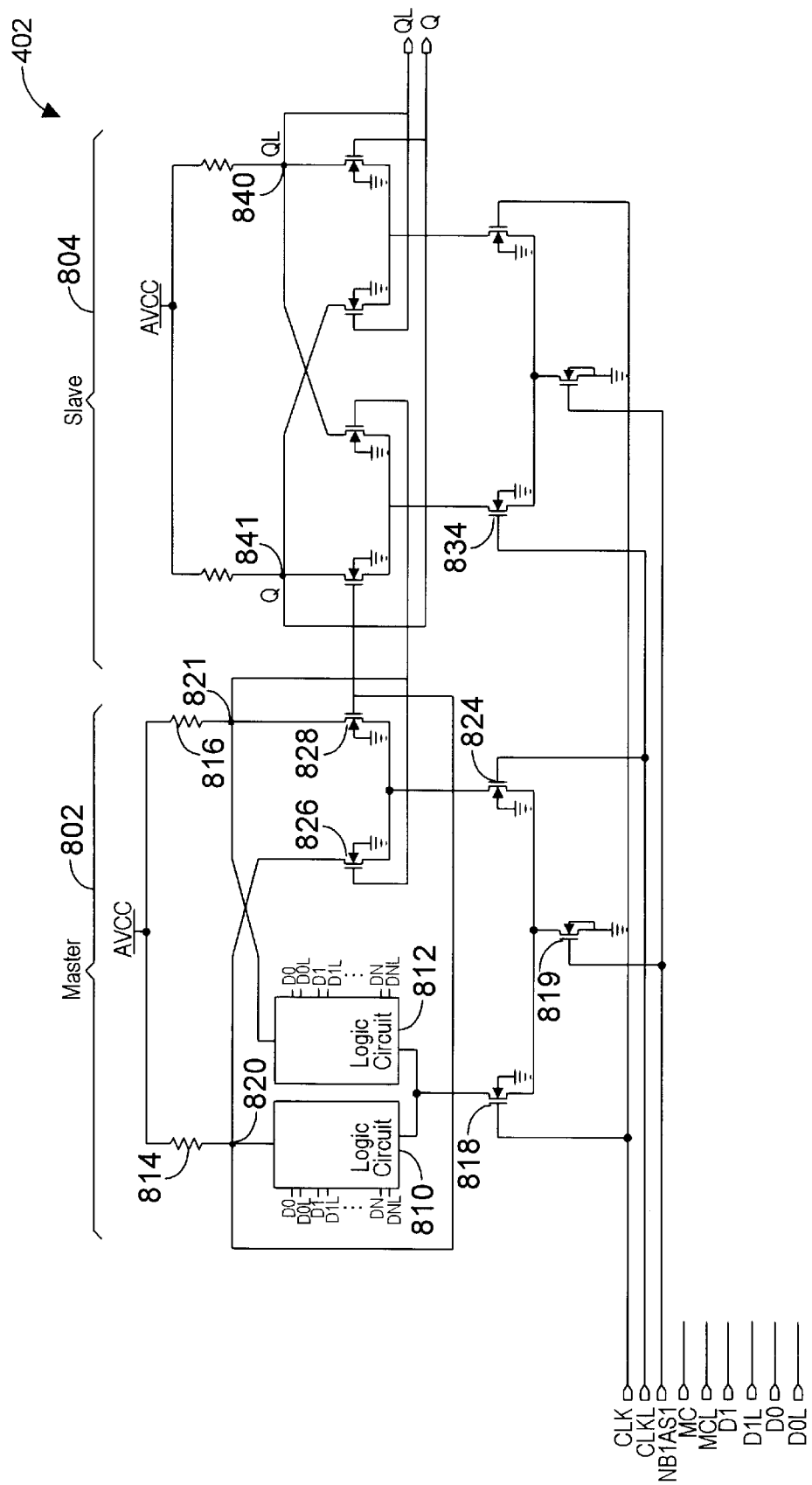
FIG. 8 is a diagram showing one embodiment of an analog flip-flop with embedded logic in accordance with one embodiment of the present invention.

Turning now to FIG. 8, one embodiment of analog flip-flop 402 is shown. The flip-flop circuit 402 includes a master section 802 and a slave section 804. Master section 802 includes logic circuits 810 and 812 coupled between loads 814 and 816 and a transistor 818 which forms a clocked switch. It is noted that logic circuits 810 and 812 replace the differential input pair of transistors 44 found in the conventional analog flip-flop circuits of FIGS. 4 and 5. During operation, upon the high period of the clock signal CLK when transistor 818 is turned on, current may flow through either logic circuit 810 or logic circuit 812 to thereby drive a first output node 820 of master section 802 to a first voltage value and a second output node 821 of master section 802 to a second voltage value. These first and second voltage values at nodes 820 and 821 form a differential set-up signal associated with master section 802, as will be discussed in further detail below. The current flowing through logic circuit 810 and thus through load 814 is dependent upon two or more of the input signals provided to logic circuit 810, and similarly, the current flowing through logic circuit 812 and thus through load 816 is dependent upon two or more of the input signals provided to logic circuit 812. Details regarding a manner in which logic circuits 810 and 812 control current flowing through loads 814 and 816, respectively, will be provided further below.

During the low phase of the clock signal CLK, transistor 818 turns off and transistor 824 turns on. Thus, current flows through either transistor 826 or transistor 828, which collectively form another differential pair of master section 802, depending upon the values established at output nodes 820 and 821 during the high phase of the clock signal. At this time, transistor 834 of slave section 804 further turns on, thus transferring the differential set-up signal established at nodes 820 and 821 to output nodes 840 and 841, respectively, of slave section 804.

Thus, the basic flip-flop operation is that of a D-Q master/slave clock architecture where the master section 802 sets up the logical levels (which are analog, in this case) on output nodes 820 and 821. This is referred to as the set up period. During the next half clock phase, the hold circuitry, formed by transistors 824, 826 and 828, latches the logic values on nodes 820 and 821. This is referred to as the hold state. During this second half clock cycle, the set up section of the slave section 804 sets the logical values for output Q and QL at nodes 841 and 840, respectively. Again, during the subsequent half clock cycle, the hold section of the slave section 804 latches in the Q and QL values while the set up circuit for the master section 804 acquires a new differential input value based on the logical inputs.

As stated above, in addition to the clock signal CLK (and its differential counterpart CLKL), logic circuit 810 and 812 receive a plurality of differential input signals. When implemented within a prescaler architecture, these differential input signals are feedback signals from latter flip-flop stages serially connected in a chain. Each logic circuit 810 and 812 includes at least two transistors, each having a gate coupled to receive one of the differential input signals (i.e., each receiving either a positive or a negative side of one of the plurality of differential input signals.) Each transistor in logic circuit 810 is connected to conduct current which flows through load 814 depending upon the respective control inputs at their gates. Similarly, each transistor within logic circuit 812 is connected to conduct current which flows through the load 816 depending upon the respective control inputs at their gates. In this manner, rather than conditionally generating the set up signal at nodes 820 and 821 depending upon a single differential input signal provided to a conventionally coupled differential pair of transistors, the set up state of flip-flop 402 is conditionally established depending upon the states of the two or more transistors within each of logic circuits 810 and 812. The transistors implemented within each logic circuit 810 and 812 may be connected to implement a desired logic function which is associated with a particular feedback path in a prescaler architecture. Further details regarding an exemplary implementation for an 8/9 dual modulus prescaler as illustrated in FIG. 6 is described next.

Figure 9:
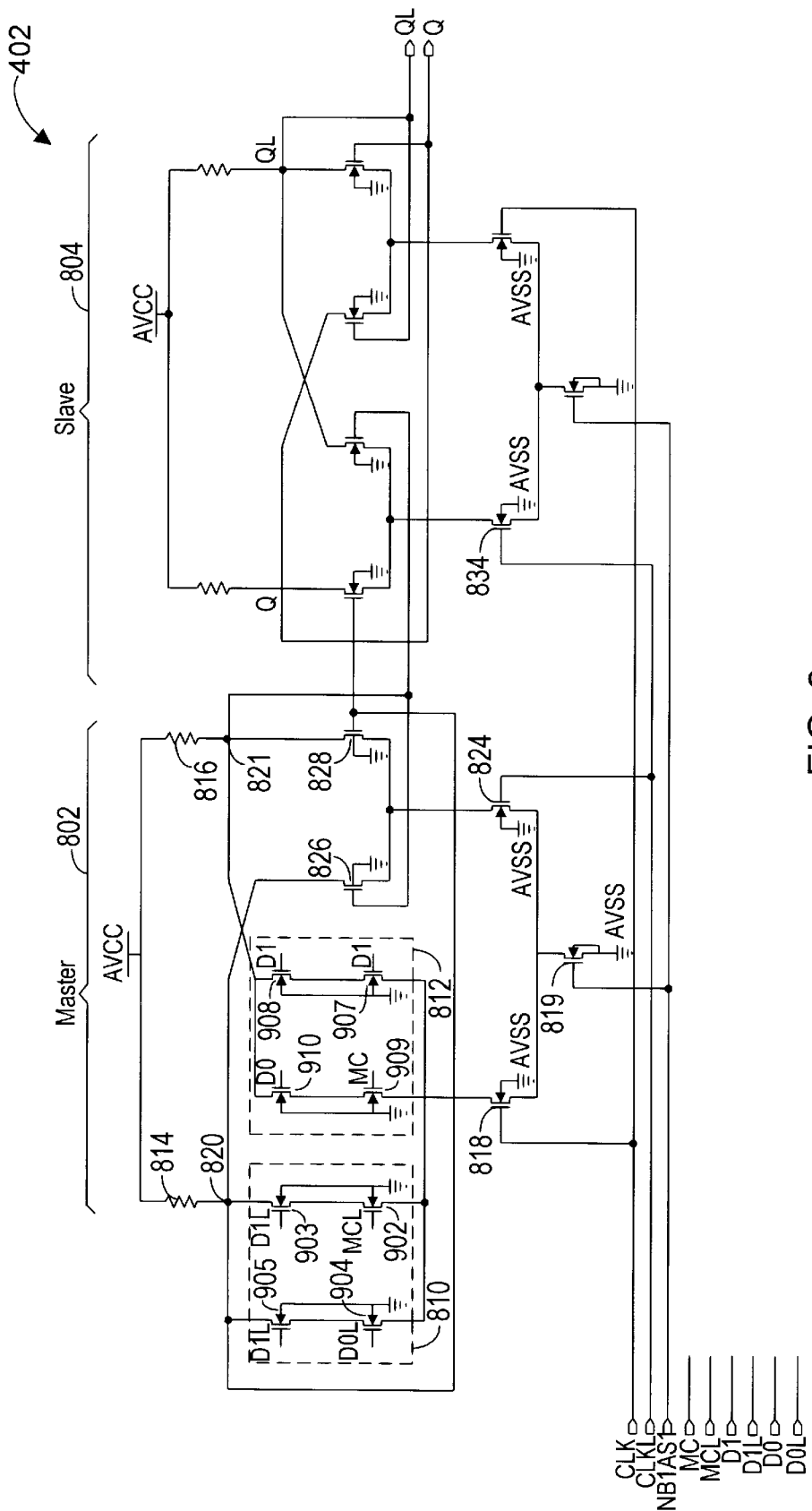
FIG. 9 is a schematic diagram that illustrates an implementation of an analog flip-flop circuit.

Thus, FIG. 9 illustrates an implementation of logic circuits 810 and 812 wherein the logic function established by the analog circuitry of gates 505 and 506 (illustrated in FIG. 7) is implemented within logic circuits 810 and 812. In FIG. 9, logic circuit 810 includes transistors 902–905, and logic circuit 812 includes transistors 907–910. It is noted that in this implementation, each of the transistors 902–905 of logic circuit 810 is connected, depending upon the state of the indicated input signal at each of their respective gates, to conduct current which flows through load 814 and through transistors 818 and 819. Similarly, each of the transistors 907–910 of logic circuit 812 are connected to conditionally conduct current which flows through load 816 depending upon the state of the indicated input signal at each of their respective gates. It is further noted that the transistors connected within logic circuits 810 and 812 to conduct current flowing through loads 814 and 816, respectively, may be either serially coupled or parallel coupled, or both, depending upon the desired logic function for the feedback path. When connected in the 8/9 dual modulus prescaler of FIG. 400, the indicated input signals at the gates of transistors 902–905 of logic circuit 810 and at the gates of transistors 907–910 of logic circuit 812 are received from the outputs of analog flip-flops 403 and 404. An additional differential input is provided from gates 415 and 416, which provide a differential signal generated in accordance with the digital logic section identified in FIG. 7.

In the specific implementation of FIG. 9, transistors 903, 905, 908 and 910 are low threshold voltage devices, while transistors 902, 904, 907 and 909 are normal enhancement transistors. Use of the low threshold devices may advantageously allow for a robust, manufacturable design.

It is also noted that in the implementation of FIG. 9, each of the transistors 902–905 within logic circuit 810 and each of the transistors 907–910 within logic circuit 812 are implemented using exclusively n-channel devices. This device type is the same as the device type used to implement the differential pair of transistors 826 and 828. It is noted that in other implementations, a converse architecture may be implemented wherein only p-channel devices are employed for both the differential pair of transistors 826 and 828 and the transistors of logic circuits 810 and 812.

It is additionally noted that the loads 814 and 816 in master section 802 as well as the loads within slave section 804 may be implemented using either active or passive devices. In addition, prescaler circuits which divide an input frequency by other amounts may also be implemented using a flip-flop circuit as illustrated in FIG. 8. In such other embodiments, the configuration and interconnection of the at least two transistors within each of logic circuits 810 and 812 may be different to accommodate other logical functionality.

Figure 10:
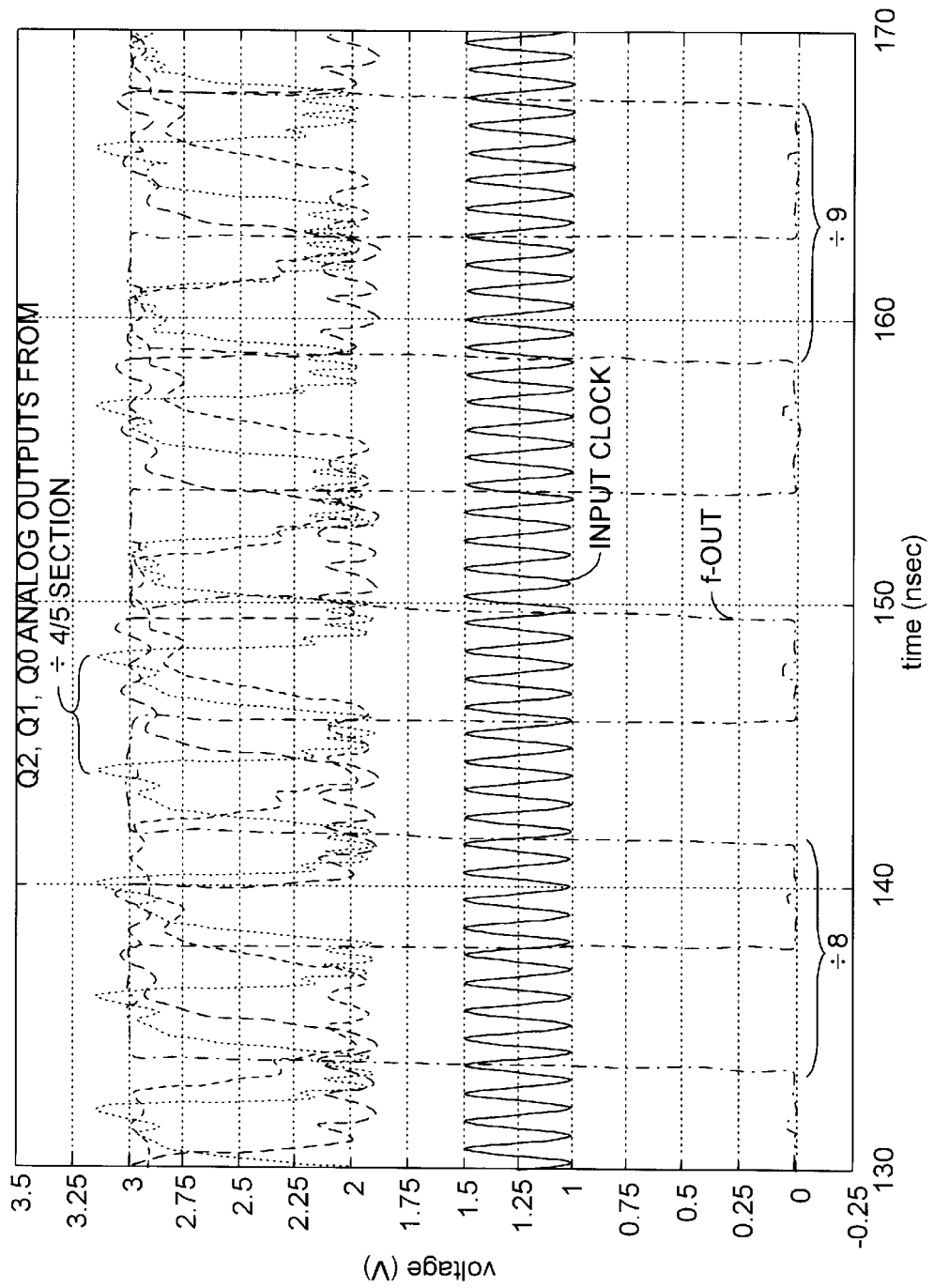
FIG. 10 is a graph which illustrates various aspects of the operation of the 8/9 dual modulus prescaler illustrated in FIG. 6.

Turning finally to FIG. 10, a graph is shown which illustrates characteristics of various signals associated with the prescaler of FIG. 6. The input clock is a 0.5 volt (peak to peak) sine wave at 1.0 ghz. The output is a full CMOS level where the divide-by-8/9 modulus changes at 150 nanoseconds.

Numerous variations and modifications will become apparent to those skilled in the art once the above disclosure is fully appreciated. It is intended that the following claims be interpreted to embrace all such variations and modifications.

What is claimed is:

1. A differential analog flip-flop circuit for receiving a plurality of differential input signals and configured to drive a differential output signal comprising:

a master section for setting a state of a differential set up signal in response to an occurrence of a first phase of a clock signal, wherein said state of said differential set up signal is dependent upon a state of said plurality of differential input signals; and a slave section coupled to said master section and configured to hold and drive said differential output signal in response to an occurrence of a second phase of said clock signal, wherein said differential output signal is indicative of a state of said differential set-up output signal;

wherein said master section includes:

a first load coupled to a first reference voltage;

a second load coupled to said first reference voltage;

a differential pair of transistors coupled to said first and second loads and configured to differentially control a flow of current through said first and second loads during said second phase of said clock signal; and a first logic circuit configured to control a current through said first load during said first phase of said clock signal, wherein said first logic circuit includes a first transistor coupled to a second transistor, wherein both said first transistor and said second transistor are connected to conduct current which flows through said first load, and wherein a gate of said first transistor is coupled to receive a first of said plurality of differential input signals and wherein a gate of said second transistor is coupled to receive a second of said plurality of differential input signals.

2. The differential analog flip-flop circuit as recited in claim 1 further comprising a second logic circuit configured to control a current through said second load during said first phase of said clock signal.

3. The differential analog flip-flop circuit as recited in claim 2 wherein said second logic circuit includes a third transistor coupled to a fourth transistor, wherein both said third transistor and said fourth transistor are connected to conduct current which flows through said second load, and wherein a gate of said third transistor is coupled to receive a second side of said first of said plurality of differential input signals and wherein a gate of said fourth transistor is coupled to receive a second side of said second of said plurality of differential input signals.

4. The differential analog flip-flop circuit as recited in claim 1 wherein a node coupled to said first load provides a first side of said differential set up signal.

5. The differential analog flip-flop circuit as recited in claim 4 wherein a node connected to said second load provides a second side of said differential set up signal.

6. The differential analog flip-flop circuit as recited in claim 1 further comprising a clocked switch coupled between said first logic circuit and a second reference voltage, wherein said clocked switch is configured to selectively allow a flow of current through said first load and through said first logic circuit only during said first phase of said clock signal.

7. The differential analog flip-flop circuit as recited in claim 6 wherein said clocked switch is implemented with a third transistor.

8. The differential analog flip-flop circuit as recited in claim 7 wherein a gate of said third transistor is coupled to receive said clock signal.

9. The differential analog flip-flop circuit as recited in claim 8 further comprising a second clocked switch coupled between said differential pair of transistors and said second reference voltage, wherein said second clocked switch is configured to selectively allow a flow of current through said second load and through said differential pair of transistors only during said second phase of said clock signal.

10. The differential analog flip-flop circuit as recited in claim 9 wherein said second clocked switch is implemented with a fourth transistor.

11. The differential analog flip-flop circuit as recited in claim 10 further comprising a current sink element coupled in series between said first and second clocked switches and said second reference voltage.

12. The differential analog flip-flop circuit as recited in claim 11 wherein said current sink is implemented with a fifth transistor having a gate coupled to receive a bias voltage.

13. A phase-locked-loop circuit comprising:

a phase detector for receiving a reference frequency signal and a divided frequency signal;

a loop filter coupled to an output of said phase detector;

a voltage controlled oscillator having an input coupled to an output of said loop filter; and a prescaler having an input coupled to receive a clock signal from an output of said voltage controlled oscillator and including a plurality of serially coupled analog flip-flops, wherein a first of said analog flip-flops includes:

a master section for setting a state of a differential set up signal in response to an occurrence of a first phase of said clock signal, wherein said state of said differential set up signal is dependent upon a state of a plurality of differential input signals; and a slave section coupled to said master section and configured to hold and drive said differential output signal in response to an occurrence of a second phase of said clock signal, wherein said differential output signal is indicative of a state of said differential output signal;

wherein said master section includes:

a first load coupled to a first reference voltage;

a second load coupled to said first reference voltage;

a differential pair of transistors coupled to said first and second loads and configured to differentially control a flow of current through said first and second loads during said second phase of said clock signal; and a first logic circuit configured to control a current through said first load during said first phase of said clock signal, wherein said first logic circuit includes a first transistor coupled to a second transistor, wherein both said first transistor and said second transistor are connected to conduct current which flows through said first load, and wherein a gate of said first transistor is coupled to receive a first of said plurality of differential input signals and wherein a gate of said second transistor is coupled to receive a second of said plurality of differential input signals.

14. The phase-locked-loop circuit as recited in claim 13 wherein said differential output signal of said first analog flip-flop is coupled to an input of a second of said analog flip-flops, and wherein a differential output of said second of said analog flip-flops is coupled to an input of a third of said analog flip-flops.

15. The phase-locked-loop circuit as recited in claim 14 wherein said differential output signal of said second of said flip-flops is coupled to feedback to said first of said analog flip-flops as one of said plurality of differential input signals.

16. The differential analog flip-flop circuit as recited in claim 15 wherein said differential output signal of said third of said flip-flops is connected to feedback to said first of said analog flip-flops as a second of said plurality of differential input signals.

17. The phase-locked-loop circuit as recited in claim 13 wherein said first of said analog flip-flops further comprises a second logic circuit configured to control a current through said second load during said first phase of said clock signal.

18. The phase-locked-loop circuit as recited in claim 17 wherein said second logic circuit includes a third transistor coupled to a fourth transistor, wherein both said third transistor and said fourth transistor are connected to conduct current which flows through said second load, and wherein a gate of said third transistor is coupled to receive a second side of said first of said plurality of differential input signals and wherein a gate of said fourth transistor is coupled to receive a second side of said second of said plurality of differential input signals.

19. The phase-locked-loop circuit as recited in claim 13 wherein a node coupled to said first load provides a first side of said differential set up signal.

20. The phase-locked-loop circuit as recited in claim 19 wherein a node connected to said second load provides a second side of said differential set up signal.

21. The phase-locked-loop circuit as recited in claim 13 further comprising a clocked switch coupled between said first logic circuit and a second reference voltage, wherein said clocked switch is configured to selectively allow a flow of current through said first load and through said first logic circuit only during said first phase of said clock signal.

22. The phase-locked-loop circuit as recited in claim 21 wherein said clocked switch is implemented with a third transistor.

23. The phase-locked-loop circuit as recited in claim 22 wherein a gate of said third transistor is coupled to receive said clock signal.

24. The phase-locked-loop circuit as recited in claim 23 wherein said first of said analog flip-flops further comprises a second clocked switch coupled between said differential pair of transistors and said second reference voltage, wherein said second clocked switch is configured to selectively allow a flow of current through said second load and through said differential pair of transistors only during said second phase of said clock signal.

25. The phase-locked-loop circuit as recited in claim 24 wherein said second clocked switch is implemented with a fourth transistor.

26. The phase-locked-loop circuit as recited in claim 25 wherein said first of said analog flip-flops further comprises a current sink element coupled in series between said first and second clocked switches and said second reference voltage.

27. The phase-locked-loop circuit as recited in claim 26 wherein said current sink is implemented with a fifth transistor having a gate coupled to receive a bias voltage.

\* \* \* \* \*